US012676390B2

(12) United States Patent
Makino et al.

(10) Patent No.: US 12,676,390 B2
(45) Date of Patent: Jul. 7, 2026

(54) FLEXIBLE WIRING COMPONENT

(71) Applicant: YAZAKI CORPORATION, Tokyo (JP)

(72) Inventors: Kimitoshi Makino, Makinohara (JP); Shuhei Urakami, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 517 days.

(21) Appl. No.: 18/481,176

(22) Filed: Oct. 4, 2023

(65) Prior Publication Data

US 2024/0128614 A1      Apr. 18, 2024

(30) Foreign Application Priority Data

Oct. 17, 2022    (JP) ................................. 2022-165958

(51) Int. Cl.
| | |
|---|---|
| *H01M 50/569* | (2021.01) |
| *G01R 31/3835* | (2019.01) |
| *H01M 50/209* | (2021.01) |
| *H01M 50/298* | (2021.01) |
| *H01M 50/358* | (2021.01) |
| *H01M 50/502* | (2021.01) |
| *H01M 50/55* | (2021.01) |

(52) U.S. Cl.
CPC ...... *H01M 50/569* (2021.01); *G01R 31/3835* (2019.01); *H01M 50/209* (2021.01); *H01M 50/298* (2021.01); *H01M 50/358* (2021.01); *H01M 50/502* (2021.01); *H01M 50/55* (2021.01)

(58) Field of Classification Search
None
See application file for complete search history.

(56) References Cited

U.S. PATENT DOCUMENTS

| | | | | |
|---|---|---|---|---|
| 10,326,181 | B2 * | 6/2019 | Zhao ................... | H01M 50/209 |
| 2018/0088179 | A1 | 3/2018 | Ota et al. | |
| 2021/0273305 | A1 | 9/2021 | Makino | |
| 2024/0128613 | A1 * | 4/2024 | Makino ............... | H01M 50/519 |

FOREIGN PATENT DOCUMENTS

| | | |
|---|---|---|
| JP | 2017-59481 A | 3/2017 |
| JP | 2018-55843 A | 4/2018 |
| JP | 2021-140865 A | 9/2021 |
| JP | 2022-74179 A | 5/2022 |

* cited by examiner

*Primary Examiner* — Tracy M Dove
(74) *Attorney, Agent, or Firm* — KENEALY VAIDYA LLP

(57) ABSTRACT

Included are a first main branch wiring part, a second main branch wiring part, a connection wiring part that connects end parts of the first and second main branch wiring parts, a first sub-branch wiring part branched from an end part of the first main branch wiring part, a second sub-branch wiring part branched from an end part of the second main branch wiring part, and a space part surrounded by the first main branch wiring part, the second main branch wiring part, and the connection wiring part. All the first sub-branch wiring parts and all the second sub-branch wiring parts are formed in a shape such that the first sub-branch wiring parts and the second sub-branch wiring parts do not stack on each other in the space part.

8 Claims, 4 Drawing Sheets

FLEXIBLE WIRING COMPONENT

CROSS-REFERENCE TO RELATED APPLICATION(S)

The present application claims priority to and incorporates by reference the entire contents of Japanese Patent Application No. 2022-165958 filed in Japan on Oct. 17, 2022.

BACKGROUND OF THE INVENTION

1. Field of the Invention

The present invention relates to a flexible wiring component.

2. Description of the Related Art

Conventionally, a vehicle (an electric vehicle, a hybrid vehicle, and the like) that uses a rotating machine as a driving source is installed with a battery module that supplies power to the rotating machine, and a battery monitoring unit that monitors the battery status of a plurality of battery cells making up the battery module. Then, the vehicle is installed with a flexible wiring component that electrically connects between the battery module and the battery monitoring unit. In the battery module in this example, a plurality of battery cells each provided with positive and negative electrode terminals are arranged on the same flat plane. The battery module includes a first electrode terminal group in which first electrode terminals are aligned in the arrangement direction, and a pair of electrode terminals adjacent to each other in the arrangement direction are electrically connected by a first inter-terminal connection component for each of the pair of electrode terminals. The battery module also includes a second electrode terminal group in which second electrode terminals are aligned in the arrangement direction, and a pair of electrode terminals adjacent to each other in the arrangement direction are electrically connected by a second inter-terminal connection component for each of the pair of electrode terminals. Consequently, the flexible wiring component includes a first main branch wiring part for electrical connection for each first inter-terminal connection component close to the first electrode terminal group between the first electrode terminal group and the second electrode terminal group, and a second main branch wiring part for electrical connection for each second inter-terminal connection component close to the second electrode terminal group between the first electrode terminal group and the second electrode terminal group. Then, this flexible wiring component includes a first sub-branch wiring part for each first inter-terminal connection component that is branched from the first main branch wiring part to the first electrode terminal group side, and a second sub-branch wiring part for each second inter-terminal connection component that is branched from the second main branch wiring part to the second electrode terminal group side. For example, Japanese Patent Application Laid-open No. 2022-74179 discloses the flexible wiring component.

Incidentally, as the flexible wiring component of this type, one configured as a single component, that is, one in which the first main branch wiring part and the second main branch wiring part are integrally formed with all the first sub-branch wiring parts and all the second sub-branch wiring parts via a connection wiring part has been known. For example, this flexible wiring component includes a voltage detection line for each first inter-terminal connection component that is routed across the first sub-branch wiring part and the connection wiring part via the first main branch wiring part between the first inter-terminal connection component side and the battery monitoring unit side, a voltage detection line for each second inter-terminal connection component that is routed across the second sub-branch wiring part and the connection wiring part via the second main branch wiring part between the second inter-terminal connection component side and the battery monitoring unit side, and an insulating cover that covers all the voltage detection lines. As a specific example, this flexible wiring component includes a base film and a coverlay film for each surface that covers the surface of the base film as the insulating cover, and the voltage detection line is routed on at least one of the surfaces of the base film.

For example, this flexible wiring component is one of a plurality of pieces die cut from a single sheet-like base material (one formed by stacking a first film serving as the base film, a voltage detection line for each flexible wiring component routed on the surface of the first film, and a second film serving as a coverlay film that covers each of the surfaces of the first film for each surface). Consequently, this conventional flexible wiring component may waste a portion in the base material that corresponds to the space part surrounded by the first main branch wiring part, the second main branch wiring part, and the connection wiring part. Moreover, in this conventional flexible wiring component, a plurality of the first sub-branch wiring parts are protruded from the first main branch wiring part to the side opposite to the space part, and a plurality of the second sub-branch wiring parts are protruded from the second main branch wiring part to the side opposite to the space part. Because the size of the conventional flexible wiring component is increased, the number of flexible wiring components that can be die cut from a sheet of base material may be reduced. In this manner, there is room for improvement in the conventional flexible wiring component in terms of yield.

SUMMARY OF THE INVENTION

Therefore, an object of the present invention is to provide a flexible wiring component with a high yield.

In order to achieve the above mentioned object, a flexible wiring component according to one aspect of the present invention includes a wiring main body in which a voltage detection line group that electrically connects between a battery module where a plurality of battery cells are arranged in a line and a battery monitoring unit that monitors a battery status of each of the battery cells is wrapped in an insulating cover, and that is formed to be flexible and flat, wherein in each of the battery cells, positive and negative electrode terminals are each disposed on a same flat plane of a cell body with an interval therebetween; the battery module includes a first electrode terminal group in which first electrode terminals in each of the battery cells are aligned in an arrangement direction of a plurality of the battery cells, and a pair of the first electrode terminals adjacent to each other in the arrangement direction are electrically connected by a first inter-terminal connection component for each of the pair of first electrode terminals, and a second electrode terminal group in which second electrode terminals in each of the battery cells are aligned in the arrangement direction, and a pair of the second electrode terminals adjacent to each other in the arrangement direction are electrically connected by a second inter-terminal connection component for each of the pair of second electrode terminals; the voltage detection line group includes a first voltage detection line that is provided for each of the first inter-terminal connection component and that electrically connects between the first inter-terminal connection component and the battery monitoring unit, and a second voltage detection line that is provided for each of the second inter-terminal connection component and that electrically connects between the second inter-terminal connection component and the battery monitoring unit; the wiring main body includes a first main branch wiring part that extends in the arrangement direction close to the first electrode terminal group between the first electrode terminal group and the second electrode terminal group, a second main branch wiring part that extends in the arrangement direction close to the second electrode terminal group between the first electrode terminal group and the second electrode terminal group, a connection wiring part that connects end parts of the first main branch wiring part and the second main branch wiring part and that electrically connects the first main branch wiring part and the second main branch wiring part to the battery monitoring unit, a first sub-branch wiring part for each of the first inter-terminal connection component that is branched from the end part of the first main branch wiring part on the second main branch wiring part side, and that electrically connects the first voltage detection line to the first inter-terminal connection component at a tip end part being branched, a second sub-branch wiring part for each of the second inter-terminal connection component that is branched from the end part of the second main branch wiring part on the first main branch wiring part side and that electrically connects the second voltage detection line to the second inter-terminal connection component at a tip end part being branched, and a space part surrounded by the first main branch wiring part, the second main branch wiring part, and the connection wiring part; and all the first sub-branch wiring parts and all the second sub-branch wiring parts are formed in a shape such that the first sub-branch wiring parts and the second sub-branch wiring parts do not stack on each other in the space part.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment of a flexible wiring component according to the present invention will be described in detail with reference to the accompanying drawings. However, this invention is not limited to this embodiment.

Embodiment

One embodiment of a flexible wiring component according to the present invention will be described with reference to FIG. 1 to FIG. 5.

Figure 1:
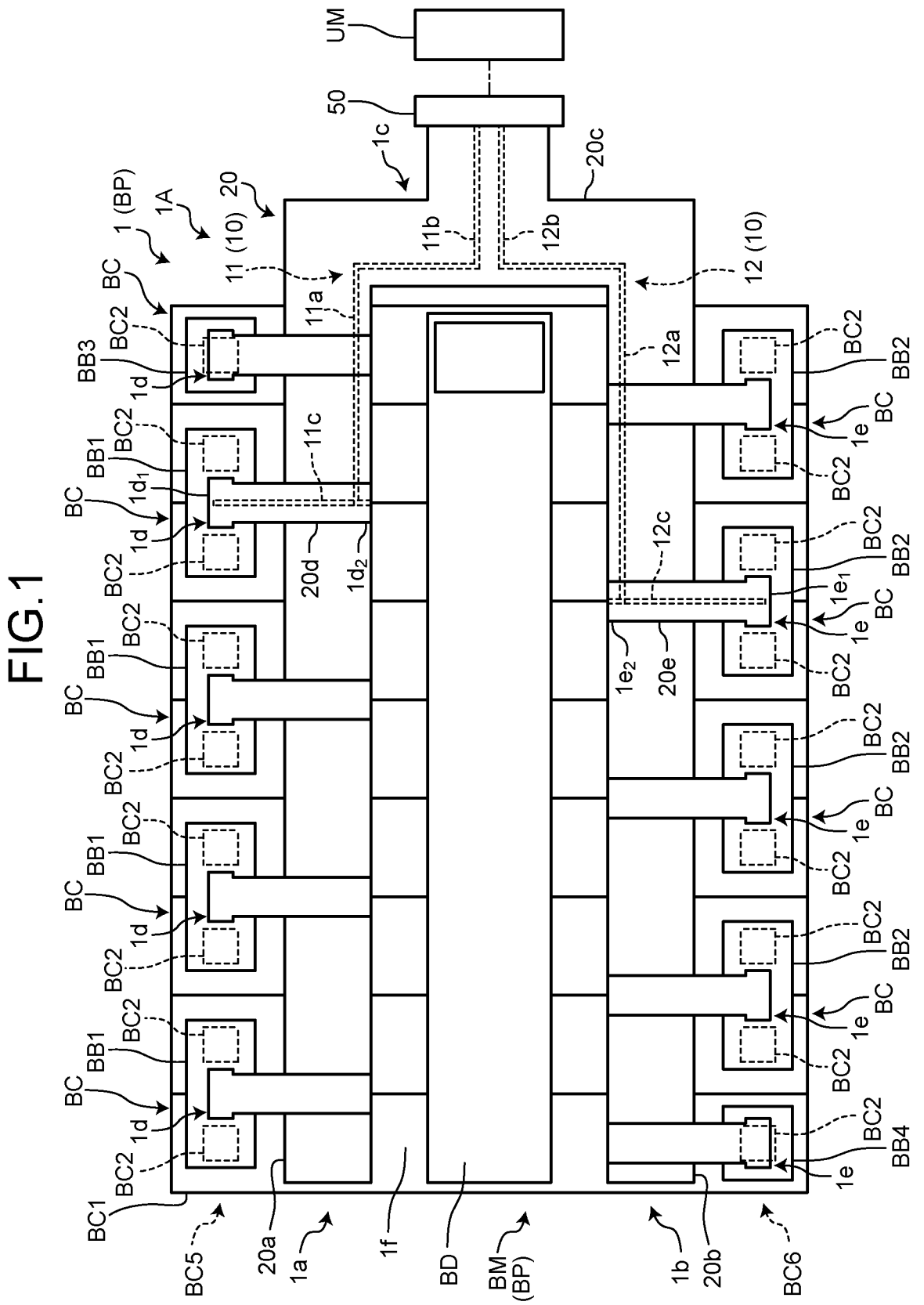
FIG. 1 is a diagram illustrating a flexible wiring component of an embodiment installed in a battery module, after a first sub-branch wiring part and a second sub-branch wiring part are folded.
Figure 2:
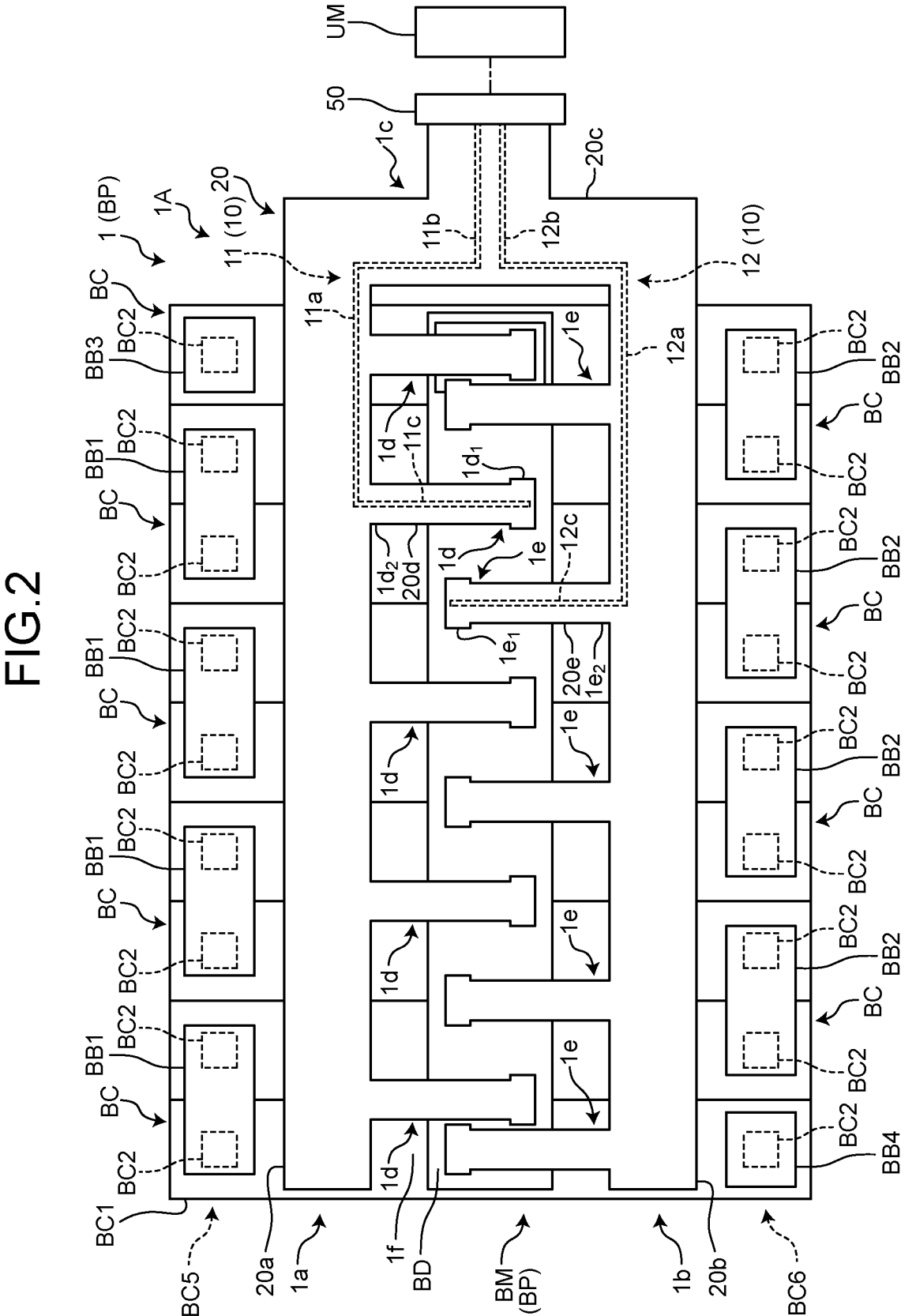
FIG. 2 is a diagram illustrating a flexible wiring component of the embodiment installed in the battery module, before the first sub-branch wiring part and the second sub-branch wiring part are folded.

The reference numeral 1 in FIG. 1 to FIG. 5 indicates a flexible wiring component of the present embodiment. By being assembled to a battery module BM in which a plurality of battery cells BC are arranged in a line, the flexible wiring component 1 configures a battery pack BP with the battery module BM (FIG. 1 and FIG. 2). For example, the battery pack BP is installed in a vehicle (an electric vehicle, a hybrid vehicle, and the like) that uses a rotating machine as a driving source, and supplies power to the rotating machine and the like.

Each of the battery cells BC includes a cell body BC1 and each of positive and negative electrode terminals BC2. In the cell body BC1, the two electrode terminals BC2 are disposed on the same flat plane with an interval therebetween (FIG. 1 and FIG. 2).

In the battery cell BC illustrated in this example, the cell body BC1 is formed in a parallelepiped shape with six exterior walls, and the two electrode terminals BC2 are provided on one of the six exterior walls of the cell body BC1. In a plurality of the battery cells BC making up the battery module BM, the cell bodies BC1 adjacent to each other in the arrangement direction are disposed so as one of the exterior walls face each other. Thus, in the battery cell BC illustrated in this example, two electrode terminals BC2 are provided on one of the four exterior walls along the arrangement direction of a plurality of the battery cells BC, among the six exterior walls of the cell body BC1. The positive electrode terminal BC2 is disposed on one end of one of the exterior walls of the cell body BC1 in the direction perpendicular to the arrangement direction of a plurality of the battery cells BC, and the negative electrode terminal BC2 is disposed on the other end of the exterior wall of the cell body BC1 in the direction perpendicular thereto.

For example, each of the electrode terminals BC2 may be formed in a plate shape or a parallelepiped shape provided on one of the exterior walls of the cell body BC1, or may be formed as a column-shaped electrode pole protruded from one of the exterior walls of the cell body BC1. When the electrode terminal BC2 is formed in a plate shape or a parallelepiped shape, a first inter-terminal connection component BB1, a second inter-terminal connection component BB2, a total positive electrode connection component BB3, or a total negative electrode connection component BB4, which will be described below, is physically and electrically connected to the electrode terminal BC2 by welding and the like. Moreover, when the electrode terminal BC2 is formed as an electrode pole, a male screw part is provided on the electrode terminal BC2. Hence, the electrode terminal BC2 is inserted into a through-hole of the first inter-terminal connection component BB1, the second inter-terminal connection component BB2, the total positive electrode connection component BB3, or the total negative electrode connection component BB4, which will be described below, and a female screw member is screwed to the male screw part of the electrode terminal BC2. Thus, the first inter-terminal connection component BB1, the second inter-terminal connection component BB2, the total positive electrode connection component BB3, or the total negative electrode connection component BB4 is physically and electrically connected to the electrode terminal BC2. In this example, the electrode terminal BC2 is formed in a rectangular plate shape.

The battery module BM includes a first electrode terminal group BC5 in which first electrode terminals BC2 in each of the battery cells BC are aligned in the arrangement direction of a plurality of the battery cells BC, and a pair of the first electrode terminals BC2 adjacent to each other in the arrangement direction are electrically connected by the first inter-terminal connection component BB1 for each of the pair of first electrode terminals BC2. The battery module BM also includes a second electrode terminal group BC6 in which second electrode terminals BC2 in each of the battery cells BC are aligned in the arrangement direction of a plurality of the battery cells BC, and a pair of the second electrode terminals BC2 adjacent to each other in the arrangement direction are electrically connected by the second inter-terminal connection component BB2 for each of the pair of second electrode terminals BC2 (FIG. 1 and FIG. 2).

In the battery module BM, to electrically connect a plurality of the battery cells BC in series, a plurality of the battery cells BC are aligned so that the first electrode terminals BC2 in the first electrode terminal group BC5 become the positive and negative electrode terminals aligned alternately in the arrangement direction, and the second electrode terminals BC2 in the second electrode terminal group BC6 become the negative and positive electrodes aligned alternately in the arrangement direction. On the other hand, in this battery module BM, to electrically connect a plurality of the battery cells BC in parallel, a plurality of the battery cells BC are aligned so that all the first electrode terminals BC2 in the first electrode terminal group BC5 become positive, and all the second electrode terminals BC2 in the second electrode terminal group BC6 become negative.

The first electrode terminal group BC5 includes a plurality of sets of pairs of the first electrode terminals BC2, and one first electrode terminal BC2 that is not included in the set of pairs. Moreover, the second electrode terminal group BC6 includes a plurality of sets of pairs of the second electrode terminals BC2, and one second electrode terminal BC2 that is not included in the set of pairs. In the battery module BM, one of the two electrode terminals BC2 that is not included in the set of pairs becomes the total positive electrode, and the other of the two electrode terminals BC2 becomes the total negative electrode. In this battery module BM, the total positive electrode connection component BB3 is electrically connected to the electrode terminal BC2 serving as the total positive electrode, and the total negative electrode connection component BB4 is electrically connected to the electrode terminal BC2 serving as the total negative electrode (FIG. 1 and FIG. 2).

The first inter-terminal connection component BB1, the second inter-terminal connection component BB2, the total positive electrode connection component BB3, and the total negative electrode connection component BB4 are each a plate-shaped conductive component made of metal, and is referred to as a bus bar. The first inter-terminal connection component BB1 and the second inter-terminal connection component BB2 illustrated in this example are the same conductive components, but are named differently for the sake of convenience. Moreover, the total positive electrode connection component BB3 and the total negative electrode connection component BB4 illustrated in this example are the same conductive components, but are named differently for the sake of convenience.

The battery module BM illustrated in this example includes an exhaust duct BD that discharges the gas discharged from the inside of the battery cell BC to the outside, between the first electrode terminal group BC5 and the second electrode terminal group BC6 (FIG. 1 and FIG. 2). In this example, the exhaust duct BD is provided between the first electrode terminal group BC5 and the second electrode terminal group BC6, and in the center thereof.

The vehicle is installed with a battery monitoring unit UM that monitors the battery status of each of the battery cells BC in the battery module BM (FIG. 1 and FIG. 2). The flexible wiring component 1 electrically connects between the battery module BM and the battery monitoring unit UM.

The flexible wiring component 1 includes a wiring main body 1A in which a voltage detection line group 10 that electrically connects between the battery module BM and the battery monitoring unit UM is covered by an insulating cover 20, and that is formed to be flexible and flat (FIG. 1 and FIG. 2).

The voltage detection line group 10 includes a plurality of voltage detection lines with flexibility. This voltage detection line group 10 includes a first voltage detection line 11 that is provided for each first inter-terminal connection component BB1 and that electrically connects between the first inter-terminal connection component BB1 and the battery monitoring unit UM, and a second voltage detection line 12 that is provided for each second inter-terminal connection component BB2 and that electrically connects between the second inter-terminal connection component BB2 and the battery monitoring unit UM (FIG. 1 and FIG. 2). Moreover, the voltage detection line group 10 illustrated in this example includes the first voltage detection line 11 that electrically connects between the total positive electrode connection component BB3 and the battery monitoring unit UM, and the second voltage detection line 12 that electrically connects between the total negative electrode connection component BB4 and the battery monitoring unit UM. In the drawing, only a portion of a plurality of the first voltage detection lines 11 and a portion of a plurality of the second voltage detection lines 12 are illustrated.

Figures 3, 4:
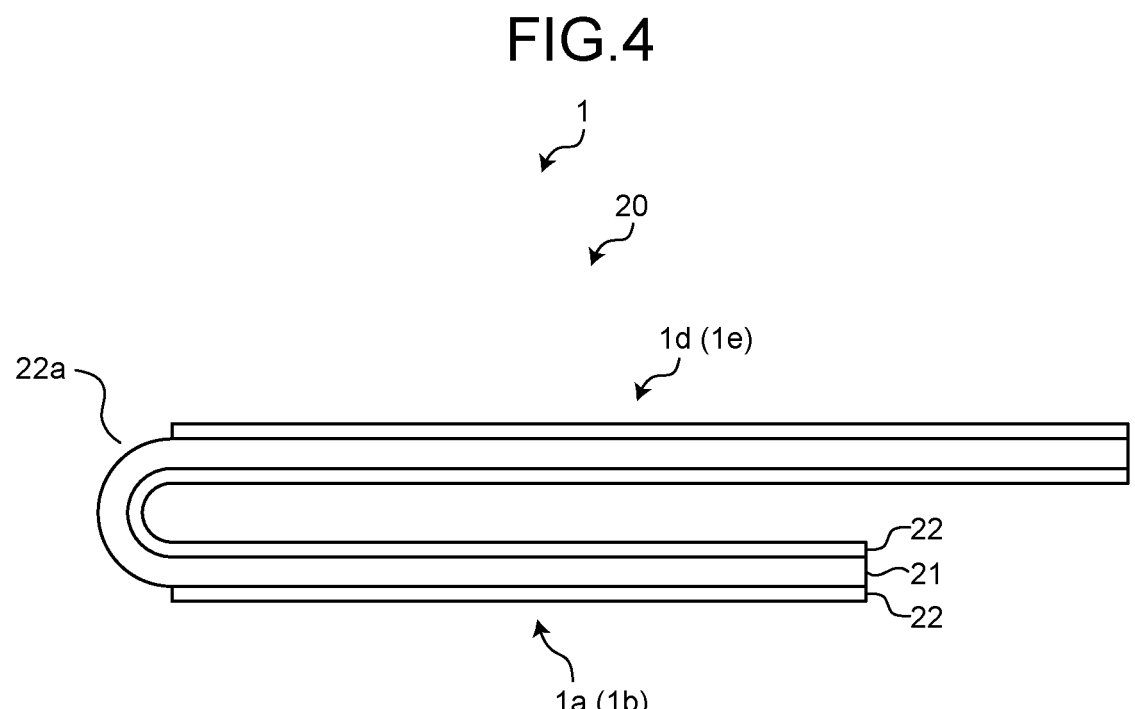
FIG. 3 is an explanatory diagram for explaining a stacking structure of a flexible wiring component.
FIG. 4 is an explanatory diagram for explaining a stacking structure of a bent part.

The flexible wiring component 1 illustrated in this example is a flexible printed circuit board (what is called an FPC), in which each of the voltage detection lines (first voltage detection line 11, second voltage detection line 12) of the voltage detection line group 10 is formed by a conductor pattern, and the insulating cover 20 is formed by various types of films that are formed to be flexible and flat. The insulating cover 20 includes a base film 21 and a coverlay film 22 for each surface that covers the surface of the base film 21 (FIG. 3). By forming each voltage detection line on at least one of the surfaces of the base film 21 as a conductor pattern, the voltage detection line group 10 is routed on the surface. For example, when each of the voltage detection lines of the voltage detection line group 10 is only formed on one of the surfaces of the base film 21, this flexible wiring component 1 is configured as a single-sided flexible printed circuit board with one conductor pattern layer. Moreover, when each of the voltage detection lines of the voltage detection line group 10 is formed on both surfaces of the base film 21, this flexible wiring component 1 is configured as a double-sided flexible printed circuit board with two conductor pattern layers.

Specifically, the wiring main body 1A includes a first main branch wiring part 1a that extends in the arrangement direction of a plurality of the battery cells BC close to the first electrode terminal group BC5, between the first electrode terminal group BC5 and the second electrode terminal group BC6, and a second main branch wiring part 1b that extends in the arrangement direction of a plurality of the battery cells BC close to the second electrode terminal group BC6, between the first electrode terminal group BC5 and the second electrode terminal group BC6 (FIG. 1 and FIG. 2).

The first main branch wiring part 1a includes a first main branch covering part 20a of the insulating cover 20, and a first main branch conductive part 11a of all the first voltage detection lines 11 (FIG. 1 and FIG. 2). The first main branch covering part 20a is a portion of the insulating cover 20 that extends in the arrangement direction of a plurality of the battery cells BC close to the first electrode terminal group BC5, between the first electrode terminal group BC5 and the second electrode terminal group BC6. The first main branch covering part 20a is formed by the corresponding portions of the base film 21 and the coverlay film 22. Moreover, the first main branch conductive part 11a is a portion of the first voltage detection line 11 that extends in the arrangement direction of a plurality of the battery cells BC, between the first electrode terminal group BC5 and the second electrode terminal group BC6, and that is wrapped in the first main branch covering part 20a. The first main branch conductive part 11a is formed on the corresponding portion of the surface of the base film 21 in the first main branch covering part 20a.

The second main branch wiring part 1b includes a second main branch covering part 20b of the insulating cover 20 and a second main branch conductive part 12a of all the second voltage detection lines 12 (FIG. 1 and FIG. 2). The second main branch covering part 20b is a portion of the insulating cover 20 that extends in the arrangement direction of a plurality of the battery cells BC close to the second electrode terminal group BC6, between the first electrode terminal group BC5 and the second electrode terminal group BC6. The second main branch covering part 20b is formed by the corresponding portions of the base film 21 and the coverlay film 22. Moreover, the second main branch conductive part 12a is a portion of the second voltage detection line 12 that extends in the arrangement direction of a plurality of the battery cells BC between the first electrode terminal group BC5 and the second electrode terminal group BC6, and that is wrapped in the second main branch covering part 20b. The second main branch conductive part 12a is formed on the corresponding portion of the surface of the base film 21 in the second main branch covering part 20b.

Furthermore, the wiring main body 1A includes a connection wiring part 1c that connects the end parts of the first main branch wiring part 1a and the second main branch wiring part 1b, and that electrically connects the first main branch wiring part 1a and the second main branch wiring part 1b to the battery monitoring unit UM (FIG. 1 and FIG. 2). This connection wiring part 1c includes a connector 50 to be fitted and connected to a connector (not illustrated) on the battery monitoring unit UM side.

The connection wiring part 1c includes a connection covering part 20c of the insulating cover 20, a first unit-side connection part 11b for all the first voltage detection lines 11, and a second unit-side connection part 12b for all the second voltage detection lines 12 (FIG. 1 and FIG. 2). The connection covering part 20c is a portion of the insulating cover 20 obtained by connecting the end parts of the first main branch covering part 20a and the second main branch covering part 20b. The connection covering part 20c is formed by the corresponding portions of the base film 21 and the coverlay film 22. Moreover, the first unit-side connection part 11b is a portion where a part folded from one end of the first main branch conductive part 11a toward the connection covering part 20c side is wrapped in the connection covering part 20c, and that electrically connects the end part thereof to the battery monitoring unit UM. The first unit-side connection part 11b is formed on the corresponding portion of the surface of the base film 21 in the connection covering part 20c. The second unit-side connection part 12b is a portion where a part folded from one end of the second main branch conductive part 12a toward the connection covering part 20c side is wrapped in the connection covering part 20c, and that electrically connects the end part thereof to the battery monitoring unit UM. The second unit-side connection part 12b is formed on the corresponding portion of the surface of the base film 21 in the connection covering part 20c.

Furthermore, the wiring main body 1A includes a first sub-branch wiring part 1d for each first inter-terminal connection component BB1 that is branched from the end part of the first main branch wiring part 1a on the second main branch wiring part 1b side, and that electrically connects the first voltage detection line 11 to the first inter-terminal connection component BB1 at a tip end part $1d_1$ being branched. The wiring main body 1A also includes a second sub-branch wiring part 1e for each second inter-terminal connection component BB2 that is branched from the end part of the second main branch wiring part 1b on the first main branch wiring part 1a side, and that electrically connects the second voltage detection line 12 to the second inter-terminal connection component BB2 at a tip end part $1e_1$ being branched (FIG. 1 and FIG. 2). The first sub-branch wiring part 1d is folded back from a root part $1d_2$ on the first main branch wiring part 1a side toward the first electrode terminal group BC5 side by 180 degrees, and electrically connects the first voltage detection line 11 to the first inter-terminal connection component BB1 at the tip end part $1d_1$ being folded back (FIG. 1 and FIG. 2). Moreover, the second sub-branch wiring part 1e is folded back from a root part lee on the second main branch wiring part 1b side toward the second electrode terminal group BC6 side by 180 degrees, and electrically connects the second voltage detection line 12 to the second inter-terminal connection component BB2 at the tip end part $1e_1$ being folded back (FIG. 1 and FIG. 2).

Furthermore, the wiring main body A illustrated in this example also includes the first sub-branch wiring part 1d for the total positive electrode connection component BB3 and the second sub-branch wiring part 1e for the total negative electrode connection component BB4. The first sub-branch wiring part 1d for the total positive electrode connection component BB3 is branched from the end part of the first main branch wiring part 1a on the second main branch wiring part 1b side, and the first voltage detection line 11 is electrically connected to the total positive electrode connection component BB3 at the tip end part $1d_1$ being branched. The first sub-branch wiring part 1d for the total positive electrode connection component BB3 is folded back from the root part $1d_2$ on the first main branch wiring part 1a side toward the first electrode terminal group BC5 side by 180 degrees, and electrically connects the first voltage detection line 11 to the total positive electrode connection component BB3 at the tip end part $1d_1$ being folded back. Moreover, the second sub-branch wiring part 1e for the total negative electrode connection component BB4 is branched from the end part of the second main branch wiring part 1b on the first main branch wiring part 1a side, and electrically connects the second voltage detection line 12 to the total negative electrode connection component BB4 at the tip end part $1e_1$ being branched. The second sub-branch wiring part 1e for the total negative electrode connection component BB4 is folded back from the root part $1e_2$ on the second main branch wiring part $1b$ side toward the second electrode terminal group BC6 side by 180 degrees, and electrically connects the second voltage detection line 12 to the total negative electrode connection component BB4 at the tip end part $1e_1$ being folded back.

The first sub-branch wiring part $1d$ includes a first sub-branch covering part $20d$ of the insulating cover 20, and a first terminal-side connection part $11c$ of the first voltage detection line 11 that is paired with the first sub-branch covering part $20d$ (FIG. 1 and FIG. 2). The first sub-branch covering part $20d$ is a portion of the insulating cover 20 branched from the end part of the first main branch covering part $20a$ on the second main branch covering part $20b$ side. The first sub-branch covering part $20d$ is formed by the corresponding portions of the base film 21 and the coverlay film 22. The first sub-branch covering part $20d$ is provided for each first voltage detection line 11. The first terminal-side connection part $11c$ is a portion of the first voltage detection line 11 that is folded from the other end of the first main branch conductive part $11a$ toward the paired first sub-branch covering part $20d$, and that is wrapped in the first sub-branch covering part $20d$ up to the tip end part $1d_1$ of the first sub-branch wiring part $1d$. The first terminal-side connection part $11c$ is formed on the corresponding portion of the first sub-branch covering part $20d$ on the surface of the base film 21.

In the first sub-branch wiring part $1d$, the coverlay film 22 of the first sub-branch covering part $20d$ at the tip end part $1d_1$ is partially cut to expose the tip end part of the first terminal-side connection part $11c$ from the cut location. The first sub-branch wiring part $1d$ is physically and electrically connected to the first inter-terminal connection component BB1, by soldering the tip end part of the first terminal-side connection part $11c$ to the first inter-terminal connection component BB1 and the like. The first sub-branch wiring part $1d$ for the total positive electrode connection component BB3 is physically and electrically connected to the total positive electrode connection component BB3, by soldering the tip end part of the first terminal-side connection part $11c$ to the total positive electrode connection component BB3 or the like.

The second sub-branch wiring part $1e$ includes a second sub-branch covering part $20e$ of the insulating cover 20 and a second terminal-side connection part $12c$ of the second voltage detection line 12 that is paired with the second sub-branch covering part $20e$ (FIG. 1 and FIG. 2). The second sub-branch covering part $20e$ is a portion of the insulating cover 20 branched from the end part of the second main branch covering part $20b$ on the first main branch covering part $20a$ side. The second sub-branch covering part $20e$ is formed by the corresponding portions of the base film 21 and the coverlay film 22. The second sub-branch covering part $20e$ is provided for each second voltage detection line 12. The second terminal-side connection part $12c$ is a portion of the second voltage detection line 12 that is folded from the other end of the second main branch conductive part $12a$ toward the paired second sub-branch covering part $20e$, and that is wrapped in the second sub-branch covering part $20e$ up to the tip end part $1e_1$ of the second sub-branch wiring part $1e$. The second terminal-side connection part $12c$ is formed on the corresponding portion of the second sub-branch covering part $20e$ on the surface of the base film 21.

In the second sub-branch wiring part $1e$, the coverlay film 22 of the second sub-branch covering part $20e$ at the tip end part $1e_1$ is partially cut to expose the tip end part of the second terminal-side connection part $12c$ from the cut location. The second sub-branch wiring part $1e$ is physically and electrically connected to the second inter-terminal connection component BB2, by soldering the tip end part of the second terminal-side connection part $12c$ to the second inter-terminal connection component BB2 or the like. The second sub-branch wiring part $1e$ for the total negative electrode connection component BB4 is physically and electrically connected to the total negative electrode connection component BB4, by soldering the tip end part of the second terminal-side connection part $12c$ to the total negative electrode connection component BB4 or the like.

The wiring main body 1A illustrated above is branched to the first main branch wiring part $1a$ on the first electrode terminal group BC5 side and the second main branch wiring part $1b$ on the second electrode terminal group BC6 side (FIG. 1 and FIG. 2), to avoid the exhaust duct BD between the first electrode terminal group BC5 and the second electrode terminal group BC6, and to prevent direct exposure to the high-temperature and high-pressure gas discharged from the exhaust duct BD. Consequently, the wiring main body 1A has a space part $1f$ surrounded by the first main branch wiring part $1a$, the second main branch wiring part $1b$, and the connection wiring part $1c$, and is installed in the battery module BM so that the exhaust duct BD is disposed in the space part $1f$ (FIG. 1 and FIG. 2). Not only the exhaust duct BD, but when another component that may be an obstruction to wire routing (hereinafter, referred to as an "obstructive component") is installed between the first electrode terminal group BC5 and the second electrode terminal group BC6, this wiring main body 1A is branched to the first main branch wiring part $1a$ on the first electrode terminal group BC5 side and the second main branch wiring part $1b$ on the second electrode terminal group BC6 side, to avoid the obstructive component.

In this example, although not illustrated, this flexible wiring component 1 is one of pieces die cut from a single sheet-like base material (one formed by stacking a first film serving as the base film 21, the first voltage detection line 11 and the second voltage detection line 12 for each flexible wiring component 1 routed on the surface of the first film, and a second film serving as the coverlay film 22 that covers each of the surfaces of the first film for each surface). Consequently, to die cut the flexible wiring component 1 from the base material at a high yield, and to effectively use the portion corresponding to the space part $1f$ in the base material, it is preferable to define the shapes of the first sub-branch wiring part $1d$ and the second sub-branch wiring part $1e$ as follows. That is, in this flexible wiring component 1, it is preferable to form all the first sub-branch wiring parts $1d$ and all the second sub-branch wiring parts $1e$ from the portion corresponding to the space part $1f$ in the base material. Thus, all the first sub-branch wiring parts $1d$ and all the second sub-branch wiring parts $1e$ illustrated in this example are formed in a shape such that the first sub-branch wiring parts $1d$ and the second sub-branch wiring parts $1e$ do not stack on each other in the space part $1f$. Therefore, all the first sub-branch wiring parts $1d$ and all the second sub-branch wiring parts $1e$ can be produced from the portion corresponding to the space part $1f$ in the base material.

After extracting all the first sub-branch wiring parts $1d$ and all the second sub-branch wiring parts $1e$ from the base material, the root parts $1d_2$ and $1e_2$ are folded, to fold back the first sub-branch wiring parts $1d$ and the second sub-branch wiring parts $1e$ from the root parts $1d_2$ and lee by 180 degrees. For example, a bending habit may also be applied to the flexible wiring component 1 before being assembled to the battery module BM, by folding the root parts $1d_2$ and $1e_2$ of all the first sub-branch wiring parts $1d$ and all the second sub-branch wiring parts $1e$. Moreover, the root parts $1d_2$ and $1e_2$ of all the first sub-branch wiring parts $1d$ and all the second sub-branch wiring parts $1e$ may be folded, when the flexible wiring component 1 is assembled to the battery module BM or after the flexible wiring component 1 is assembled to the battery module BM.

Figure 5:
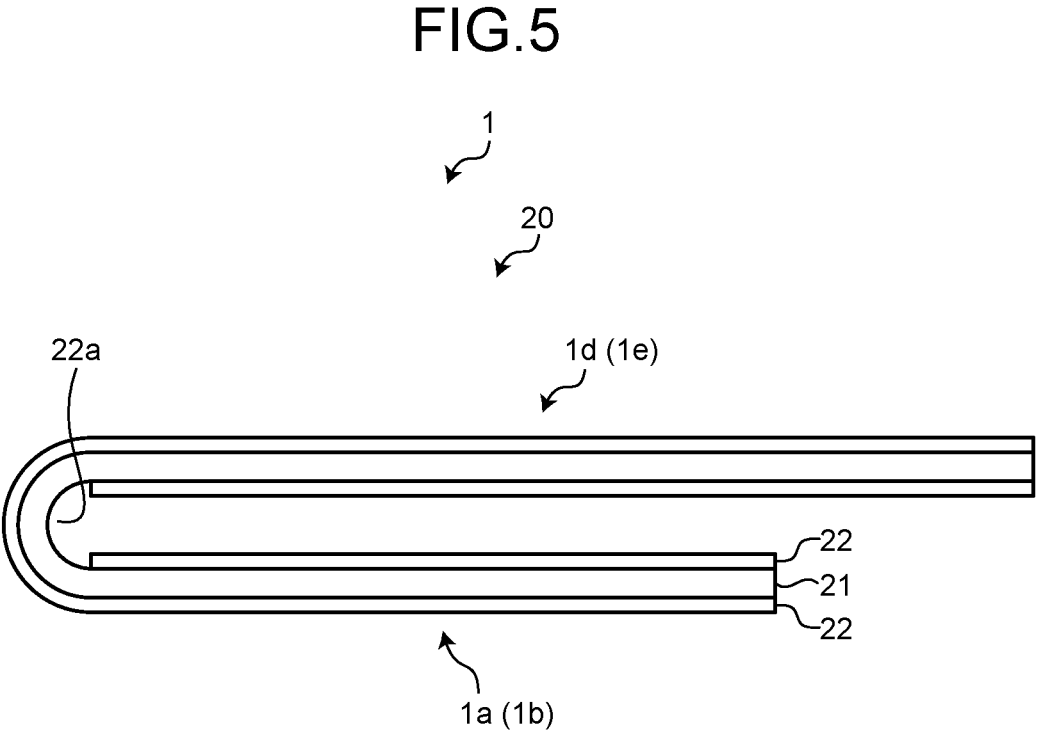
FIG. 5 is an explanatory diagram for explaining a stacking structure of a bent part.

It is preferable to configure this flexible wiring component 1 as follows, to easily fold the root parts $1d_2$ and $1e_2$ of the first sub-branch wiring part $1d$ and the second sub-branch wiring part $1e$, and to easily give a bending habit to the root parts $1d_2$ and $1e_2$. Therefore, this flexible wiring component 1 is provided with a cut-off part $22a$ in which at least one of a portion serving as the outside of the bend at each of the root parts $1d_2$ and $1e_2$ of the first sub-branch wiring part $1d$ and the second sub-branch wiring part $1e$ in one of the coverlay films 22, and a portion serving as the inside of the bend at each of the root parts $1d_2$ and $1e_2$ of the first sub-branch wiring part $1d$ and the second sub-branch wiring part $1e$ in the other coverlay film 22 is being cut off (FIG. 4 and FIG. 5).

For example, between the two surfaces on the base film 21, the voltage detection line group 10 (first voltage detection line 11, second voltage detection line 12) is routed at least on the surface serving as the inside of the bend at each of the root parts $1d_2$ and $1e_2$ of the first sub-branch wiring part $1d$ and the second sub-branch wiring part $1e$. In this case, it is preferable to provide the cut-off part $22a$ on the portion serving as the outside of the bend at each of the root parts $1d_2$ and $1e_2$ of the first sub-branch wiring part $1d$ and the second sub-branch wiring part $1e$ in one of the coverlay films 22 so that the voltage detection line group 10 is not exposed at each of the root parts $1d_2$ and $1e_2$ of the first sub-branch wiring part $1d$ and the second sub-branch wiring part $1e$ (FIG. 4). Consequently, in the first sub-branch wiring part $1d$, the first terminal-side connection part $11c$ of the first voltage detection line 11 is routed on the surface serving as the inside of the bend of the base film 21. Moreover, in the second sub-branch wiring part $1e$, the second terminal-side connection part $12c$ of the second voltage detection line 12 is routed on the surface serving as the inside of the bend of the base film 21.

Furthermore, by folding back the first sub-branch wiring part $1d$ and the second sub-branch wiring part $1e$ at each of the root parts $1d_2$ and $1e_2$, the first terminal-side connection part $11c$ of the first voltage detection line 11 and the second terminal-side connection part $12c$ of the second voltage detection line 12 hardly come into contact with the inside of the bend. Thus, the cut-off part $22a$ may be provided on the portion serving as the inside of the bend at each of the root parts $1d_2$ and $1e_2$ of the first sub-branch wiring part $1d$ and the second sub-branch wiring part $1e$ in the other coverlay film 22 (FIG. 5). Still furthermore, the cut-off part $22a$ may also be provide on the portion serving as the outside of the bend at each of the root parts $1d_2$ and $1e_2$ of the first sub-branch wiring part $1d$ and the second sub-branch wiring part $1e$ in one of the coverlay films 22, and the portion serving as the inside of the bend at each of the root parts $1d_2$ and $1e_2$ of the first sub-branch wiring part $1d$ and the second sub-branch wiring part $1e$ in the other coverlay film 22.

As illustrated above, the flexible wiring component 1 of the present embodiment has the space part $1f$ surrounded by the first main branch wiring part $1a$, the second main branch wiring part $1b$, and the connection wiring part $1c$, and can form all the first sub-branch wiring parts $1d$ and all the second sub-branch wiring parts $1e$ from the portion corresponding to the space part $1f$ in the base material. Consequently, because the portion corresponding to the space part $1f$ in the base material can be used effectively, this flexible wiring component 1 can improve the yield when a plurality of the flexible wiring components 1 are die cut from the base material. Moreover, because all the first sub-branch wiring parts $1d$ and all the second sub-branch wiring parts $1e$ are disposed in a portion corresponding to the space part $1f$ in the base material, it is possible to reduce the size of the flexible wiring component 1 before being cut out and immediately after being cut out from the base material (that is, the size before all the first sub-branch wiring parts $1d$ and all the second sub-branch wiring parts $1e$ are folded). Therefore, this flexible wiring component 1 can increase the number of flexible wiring components 1 that can be extracted from the base material, and improve the yield when a plurality of the flexible wiring components 1 are die cut from the base material.

The flexible wiring component according to the present embodiment has the space part surrounded by the first main branch wiring part, the second main branch wiring part, and the connection wiring part, and can form all the first sub-branch wiring part and all the second sub-branch wiring part from the portion corresponding to the space part in the base material. Consequently, because the portion corresponding to the space part in the base material can be used effectively, this flexible wiring component can improve the yield when a plurality of the flexible wiring components are die cut from the base material. Moreover, because all the first sub-branch wiring parts and all the second sub-branch wiring parts are disposed in a portion corresponding to the space part in the base material, it is possible to reduce the size of the flexible wiring component before being cut out and immediately after being cut out from the base material. Therefore, this flexible wiring component can increase the number of flexible wiring components that can be extracted from the base material, and improve the yield when a plurality of the flexible wiring components are die cut from the base material.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A flexible wiring component, comprising:

a wiring main body in which a voltage detection line group that electrically connects between a battery module where a plurality of battery cells are arranged in a line and a battery monitoring unit that monitors a battery status of each of the battery cells is wrapped in an insulating cover, and that is formed to be flexible and flat, wherein in each of the battery cells, positive and negative electrode terminals are each disposed on a same flat plane of a cell body with an interval therebetween;

the battery module includes a first electrode terminal group in which first electrode terminals in each of the battery cells are aligned in an arrangement direction of a plurality of the battery cells, and a pair of the first electrode terminals adjacent to each other in the arrangement direction are electrically connected by a first inter-terminal connection component for each of the pair of first electrode terminals, and a second electrode terminal group in which second electrode terminals in each of the battery cells are aligned in the arrangement direction, and a pair of the second electrode terminals adjacent to each other in the arrangement direction are electrically connected by a second inter-terminal connection component for each of the pair of second electrode terminals;

the voltage detection line group includes a first voltage detection line that is provided for each of the first inter-terminal connection component and that electrically connects between the first inter-terminal connection component and the battery monitoring unit, and a second voltage detection line that is provided for each of the second inter-terminal connection component and that electrically connects between the second inter-terminal connection component and the battery monitoring unit;

the wiring main body includes a first main branch wiring part that extends in the arrangement direction close to the first electrode terminal group between the first electrode terminal group and the second electrode terminal group, a second main branch wiring part that extends in the arrangement direction close to the second electrode terminal group between the first electrode terminal group and the second electrode terminal group, a connection wiring part that connects end parts of the first main branch wiring part and the second main branch wiring part and that electrically connects the first main branch wiring part and the second main branch wiring part to the battery monitoring unit, a first sub-branch wiring part for each of the first inter-terminal connection component that is branched from the end part of the first main branch wiring part on the second main branch wiring part side, and that electrically connects the first voltage detection line to the first inter-terminal connection component at a tip end part being branched, a second sub-branch wiring part for each of the second inter-terminal connection component that is branched from the end part of the second main branch wiring part on the first main branch wiring part side and that electrically connects the second voltage detection line to the second inter-terminal connection component at a tip end part being branched, and a space part surrounded by the first main branch wiring part, the second main branch wiring part, and the connection wiring part; and all the first sub-branch wiring parts and all the second sub-branch wiring parts are formed in a shape such that the first sub-branch wiring parts and the second sub-branch wiring parts do not stack on each other in the space part.

2. The flexible wiring component according to claim 1, wherein the first sub-branch wiring part is folded back from a root part on the first main branch wiring part side toward the first electrode terminal group side by 180 degrees, and electrically connects the first voltage detection line to the first inter-terminal connection component at the tip end part being folded back, and the second sub-branch wiring part is folded back from a root part on the second main branch wiring part side toward the second electrode terminal group side by 180 degrees, and electrically connects the second voltage detection line to the second inter-terminal connection component at the tip end part being folded back.

3. The flexible wiring component according to claim 1, wherein the battery module includes an exhaust duct that discharges gas discharged from an inside of the battery cell to an outside, between the first electrode terminal group and the second electrode terminal group, and the wiring main body is installed in the battery module so that the exhaust duct is disposed in the space part.

4. The flexible wiring component according to claim 2, wherein the battery module includes an exhaust duct that discharges gas discharged from an inside of the battery cell to an outside, between the first electrode terminal group and the second electrode terminal group, and the wiring main body is installed in the battery module so that the exhaust duct is disposed in the space part.

5. The flexible wiring component according to claim 1, wherein the insulating cover includes a base film and a coverlay film for each surface that covers the surface of the base film, and the voltage detection line group is routed on at least one of the surfaces of the base film.

6. The flexible wiring component according to claim 2, wherein the insulating cover includes a base film and a coverlay film for each surface that covers the surface of the base film, and the voltage detection line group is routed on at least one of the surfaces of the base film.

7. The flexible wiring component according to claim 2, wherein the insulating cover includes a base film and a coverlay film for each surface that covers the surface of the base film, and the flexible wiring component is provided with a cut-off part in which at least one of a portion serving as an outside of a bend at each of the root parts of the first sub-branch wiring part and the second sub-branch wiring part in one of the coverlay films, and a portion serving as an inside of a bend at each of the root parts of the first sub-branch wiring part and the second sub-branch part in the other coverlay film is being cut off.

8. The flexible wiring component according to claim 7, wherein between the two surfaces of the base film, the voltage detection line group is routed on at least the surface serving as the inside of the bend at each of the root parts of the first sub-branch wiring part and the second sub-branch wiring part, and the cut-off part is provided on the portion serving as the outside of the bend at each of the root parts of the first sub-branch wiring part and the second sub-branch wiring part in the one coverlay film.

* * * * *